(12) United States Patent
Naruse

(10) Patent No.: US 7,862,864 B2
(45) Date of Patent: Jan. 4, 2011

(54) BAR COATING METHOD AND APPARATUS

(75) Inventor: Yasuhito Naruse, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 844 days.

(21) Appl. No.: 11/783,167

(22) Filed: Apr. 6, 2007

(65) Prior Publication Data

US 2007/0237892 A1 Oct. 11, 2007

(30) Foreign Application Priority Data

Apr. 10, 2006 (JP) .............................. 2006-107495

(51) Int. Cl.
*B05D 1/28* (2006.01)
*B05C 1/00* (2006.01)

(52) U.S. Cl. .............................. 427/428.01; 427/207.1; 427/208.8; 427/355; 427/428.09; 427/428.11; 427/428.18; 427/428.19; 427/428.2; 427/428.21; 118/208; 118/211; 118/217; 118/244; 118/255

(58) Field of Classification Search ............ 427/428.01, 427/428.09, 428.2, 207.1, 208.8, 355, 428.11, 427/428.18, 428.19, 428.21; 118/208, 211, 118/217, 244, 255

See application file for complete search history.

(56) References Cited

U.S. PATENT DOCUMENTS

| 4,263,870 A * | 4/1981 | Saito et al. ................... 118/259 |
| 2002/0076499 A1 | 6/2002 | Kanke et al. |
| 2003/0217692 A1* | 11/2003 | Kanke et al. ................. 118/407 |
| 2003/0232143 A1* | 12/2003 | Ichikawa ..................... 427/359 |

FOREIGN PATENT DOCUMENTS

| EP | 1 219 358 A2 | 7/2002 |
| JP | 2-90972 A | 3/1990 |
| JP | 2002-192050 A | 7/2002 |

* cited by examiner

*Primary Examiner*—Michael Cleveland
*Assistant Examiner*—Nathan H Empie
(74) *Attorney, Agent, or Firm*—Sughrue Mion, PLLC

(57) ABSTRACT

The present invention provides a bar coating method comprising the step of: weighing and applying a coating liquid by the bar with bringing the bar into contact with a continuously running web and supplying the coating liquid to an feed side of the web with respect to the bar to form a coating liquid puddle, wherein a plurality of coating liquids are supplied to the feed side of the web with respect to the bar via a plurality of slits formed in a multistage form in an feed direction of the web in order to apply the coating liquid having a high viscosity or low wettability without problems.

2 Claims, 4 Drawing Sheets

BAR COATING METHOD AND APPARATUS

BACKGROUND OF THE INVENTION

1. Field of the Invention

The present invention relates to a bar coating method and apparatus and, more particularly, to a bar coating method and apparatus in which a coating liquid having a high viscosity or low wettability is applied.

2. Description of the Related Art

A lithographic printing plate is manufactured as described below. A web of pure aluminum or aluminum alloy is grained, and an anodic oxide film is formed on the surface thereof as necessary, by which a web that serves as a base material is prepared. Further, a photosensitive layer forming liquid or a thermally-sensitive layer forming liquid is applied to the grained surface of the web, and the web is dried to form a photosensitive or thermally-sensitive platemaking surface. In such a manufacturing process, when a coating liquid such as the photosensitive layer forming liquid or the thermally-sensitive layer forming liquid is applied to the web, a bar coater is generally used.

The bar coater is an apparatus in which a bar is brought into contact with a continuously running web, and a coating liquid is supplied to the web feed side through a slit, by which the coating liquid is weighed and applied by the bar. As the type of bar coater, a large number of types have so far been published. Japanese Patent Application Laid-Open No. 2-90972 has disclosed the shape of a weir plate on the coating liquid supply side, and Japanese Patent Application Laid-Open No. 2002-192050 has disclosed a device for preventing an air film accompanying the web surface from being brought to a coating liquid puddle.

In either of the bar coaters, if a coating liquid having a high viscosity is applied to a web running at a high speed, there arises a problem in that a defect such as film breaking occurs on a coating film, and the coating operation is unstable.

Therefore, in Japanese Patent Application Laid-Open No. 2-90972, a bar coating method in which a clearance between the weir plate and the bar is regulated is described as a method for uniformly applying a coating liquid having a medium viscosity to a web running at a speed of about 100 m/min. Also, in Japanese Patent Application Laid-Open No. 2002-192050, a bar coating method in which the weir plate having a certain thickness is provided on the web feed side as a method for applying a coating liquid having a medium viscosity at a far higher speed.

SUMMARY OF THE INVENTION

However, the conventional coating method has a problem in that even in the case where the bar coating method described in Japanese Patent Application Laid-Open No. 2-90972 or Japanese Patent Application Laid-Open No. 2002-192050 is used, if a coating liquid having a high viscosity is applied, the coating liquid itself becomes difficult to get stuck, or defects called streaks and eye holes occur even if the coating liquid can be applied, so that it is very difficult to obtain an even surface shape. Such a problem arises even when a coating liquid having low wettability is applied to the web by using the bar.

The present invention has been made in view of the above circumstances, and accordingly an object thereof is to provide a bar coating method and apparatus in which a coating liquid having a high viscosity or a coating liquid having low wettability with respect to a web can be applied uniformly.

To achieve the above object, a first aspect of the present invention provides a bar coating method comprising the step of weighing and applying a coating liquid by the bar with bringing the bar into contact with a continuously running web and supplying the coating liquid to an feed side of the web with respect to the bar to form a coating liquid puddle, wherein a plurality of coating liquids are supplied to the feed side of the web with respect to the bar via a plurality of slits formed in a multistage form in an feed direction of the web.

The inventor of the present invention devised a method for sending coating liquids having a different viscosity from a plurality of slits as a bar coating method for uniformly applying a coating liquid having a high viscosity or a coating liquid having low wettability. The inventor obtained a knowledge that, for example, when it is desired to apply the coating liquid having a high viscosity, a coating liquid having a low viscosity is supplied from the upstream slit on the feed side and is first applied to the web, and then a coating liquid having a high viscosity supplied from other slits is applied, by which an even coating surface shape can be obtained easily. Also, the inventor obtained a knowledge that to the upstream slit on the feed side of the web, of the plurality of slits formed in a multistage form, a coating liquid the main component of which is a solvent having high surface tension is supplied, by which an even coating surface shape can be obtained easily.

The present invention has been made based on such knowledge. Since the plurality of coating liquids are supplied to the feed side of the web with respect to the bar from the plurality of slits formed in a multistage form in the feed direction of the web, for example, after the coating liquid having a low viscosity has first been applied to the web, the coating liquid having a high viscosity can be applied. Thereby, even in the case where the sticking properties are low when the coating liquid having a high viscosity is applied directly to the web, the coating liquid having a high viscosity can be applied uniformly by first sticking the coating liquid having a low viscosity. Therefore, even if a coating liquid having low sticking properties such as high viscosity or low wettability is applied, an even coating surface shape can be obtained, and further the coating speed can be increased.

A second aspect of the present invention is characterized in that in the first aspect of the present invention, a coating liquid supplied to the upstream slit on the feed side of the web, of the plurality of slits formed in a multistage form has a lower viscosity than a coating liquid supplied to the other slits.

According to the second aspect of the present invention, since a coating liquid having a low viscosity is supplied to the upstream slit on the feed side, the coating liquid having a low viscosity first comes into contact with the web, so that coating defects such as streaks and eye holes are less liable to occur. Thereby, even if the coating liquid has a high viscosity as a whole, an even coating surface shape can be obtained easily, and the coating speed can be increased.

A third aspect of the present invention is characterized in that in the first aspect of the present invention, a coating liquid supplied to the upstream slit on the feed side of the web, of the plurality of slits formed in a multistage form has a solvent composition the main component of which is a solvent having a highest surface tension of solvents contained in a coating film forming solvent.

According to the third aspect of the present invention, by supplying the coating liquid the main component of which is a solvent having high surface tension to the upstream slit on the feed side, the coating liquid on the feed side of the web with respect to the bar is formed stably, and the capability for applying the coating liquid uniformly increases significantly. Therefore, even if the coating liquid having a high viscosity or low wettability is applied, an even coating surface shape can be obtained easily, and the coating can be performed at a high speed. In the present invention, the solvent of main component means a solvent having the highest ratio of the plurality of solvents.

To achieve the above object, a fourth aspect of the present invention provides a bar coating apparatus including a bar provided so as to come into contact with a continuously running web; and a plurality of slits formed in a multistage form in the feed direction of the web on the feed side of the web with respect to the bar to send coating liquids, wherein a coating liquid puddle is formed on the feed side of the web by the coating liquids sent by the plurality of slits, whereby the coating liquids are weighed and applied by the bar.

According to the fourth aspect of the present invention, for example, the plurality of coating liquids having a different viscosity can be supplied via the plurality of slits. Therefore, even if a coating liquid having low sticking properties such as high viscosity or low wettability is applied, an even coating surface shape can be obtained easily, and the coating speed can be increased.

According to the present invention, the capability for applying the coating liquid uniformly increases significantly, so that even the coating liquid having low sticking properties such as high viscosity or low wettability can be applied uniformly, and further the coating speed can be increased.

DETAILED DESCRIPTION OF THE PREFERRED EMBODIMENTS

Figure 1:
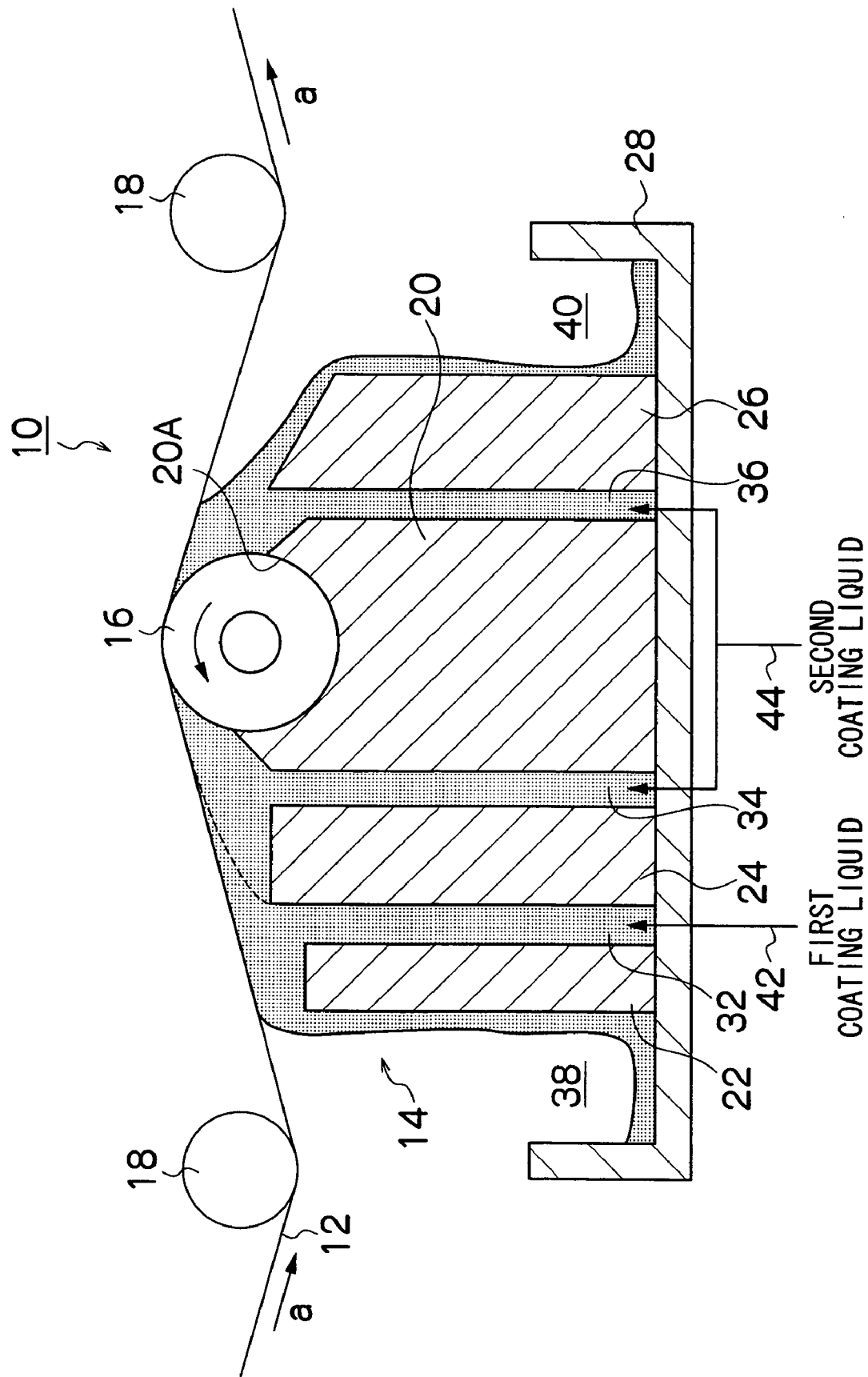
FIG. 1 is a configuration view of a bar coating apparatus to which the present invention is applied.

Preferred embodiments of a bar coating method and apparatus in accordance with the present invention will now be described with reference to the accompanying drawings. FIG. 1 is a sectional view schematically showing a configuration of a bar coating apparatus of a first embodiment to which the present invention is applied.

A bar coating apparatus 10, which is an apparatus that applies a coating liquid to a web (band-shaped base material) 12 running continuously along the running direction "a", includes a coating head 14 having a bar 16, and guide rollers 18 for guiding the web 12 in such a manner that the web 12 is in contact with the bar 16.

The bar 16 of the coating head 14 is formed into a columnar shape. The bar 16 may be formed with grooves provided at fixed intervals in the circumferential direction, or a wire may be wound closely on the bar 16, or the surface of the bar 16 may be smooth. Also, the bar 16 is connected to a rotationally driving device, not shown, so that the bar 16 is rotated in the direction opposite to the running direction of the web 14 at a speed approximately equal to the running speed of the web 12. The bar 16 is not limited to a bar having a smooth surface. Grooves may be provided at fixed intervals in the circumferential direction, or a wire may be wound closely on the bar 16. Also, the bar 16 may be rotated in the same direction as the running direction of the web 12, and further may be rotated so that the circumferential speed thereof is different from the running speed of the web 12.

The bar 16 is supported by a support member 20. In the upper part of the support member 20, an arc-shaped groove 20A is formed so that the bar 16 is rotatably supported in the groove 20A. The lower part of the support member 20 is fixed to a concavely-shaped base. To this base, weir plates 22, 24 and 26, described later, are fixed.

On the upstream side in the running direction of the web 12 with respect to the bar 16 (namely, the feed side of the web 12), the weir plates 22 and 24 are provided. The weir plate 24 is disposed in parallel with the support member 20 at a predetermined interval, and a slit 34 is formed between the weir plate 24 and the support member 20. The weir plate 22 is disposed in parallel with the weir plate 24 at a predetermined interval, and a slit 32 is formed between the weir plate 22 and the weir plate 24. Thereby, the two slits 32 and 34 are formed in a multistage form in the feed direction of the web 12. Although FIG. 1 shows an example in which the upper parts of the weir plates 22 and 24 each have a horizontal flat shape, the upper shapes of the weir plates 22 and 24 are not subject to any special restriction. For example, the upper parts of the weir plates 22 and 24 each may have a shape inclined in the same direction as the running direction of the web 12.

The slits 32 and 34 are connected with coating liquid supply lines 42 and 44, respectively. The supply lines 42 and 44 are configured so as to send a first coating liquid and a second coating liquid, respectively, and the first and second coating liquids are supplied to the slits 32 and 34, respectively.

The first and second coating liquids preferably have the same composition, and have a different viscosity. The first coating liquid has a lower viscosity than the second coating liquid, and both of the coating liquids are discharged from the slits 32 and 34, respectively. Thereby, a coating liquid puddle (bead) is formed on the feed side of the web 12. The first and second coating liquids may have a different composition. For example, the first coating liquid may be one or a plurality of mixed liquids of the solvent of the second coating liquid.

The supply lines 42 and 44 may be connected to respective storage tanks for the first and second coating liquids. Alternatively, the supply lines 42 and 44 may be connected to the same tank, and a viscosity regulator may be provided in a midway portion of each of the supply lines 42 and 44 to individually regulate the viscosity of coating liquid in each of the supply lines 42 and 44.

On the other hand, on the downstream side in the running direction of the web 12 with respect to the bar 16, the weir plate 26 is provided. The weir plate 26 is disposed in parallel with the support member 20 at a predetermined interval, and a slit 36 is formed between the weir plate 26 and the support member 20. Like the slit 34, the slit 36 is supplied with the second coating liquid. The coating liquid supplied to the slit 36 is not limited to the second coating liquid, and may be a coating liquid having a higher viscosity than the coating liquid supplied to the first slit 32.

On the upstream side of the weir plate 22 and on the downstream side of the weir plate 26, liquid reservoir parts 38 and 40 are formed, respectively. The excess coating liquid weighed by the bar 16 is stored in the liquid reservoir parts 38 and 40, and then discharged from the liquid reservoir parts 38 and 40 through a discharge line, not shown. The coating liquid having been discharged from the liquid reservoir parts 38 and 40 may be circulatingly supplied to the slits 32, 34 and 36 after the viscosity thereof has been regulated.

Figure 4:
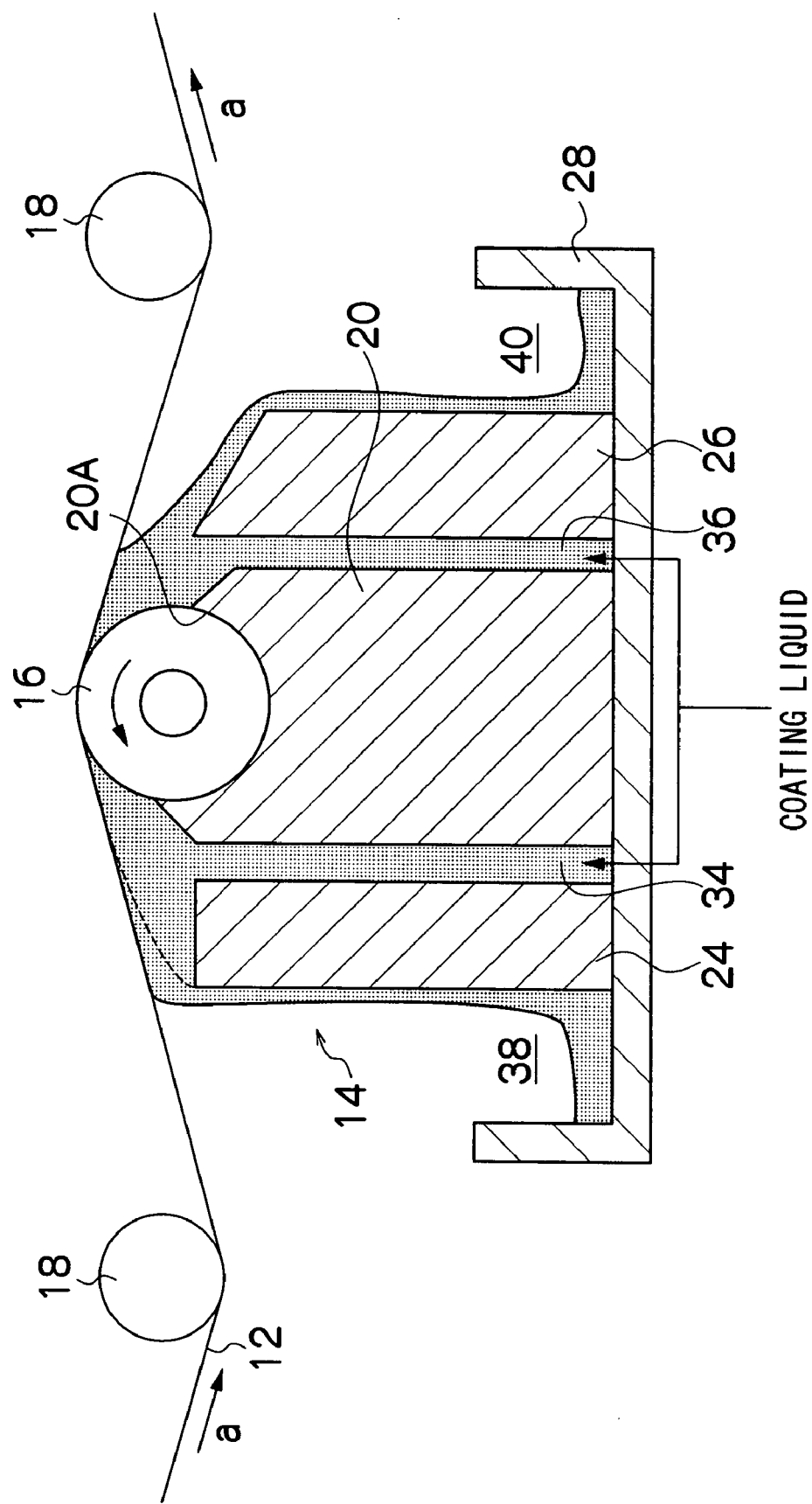
FIG. 4 is a configuration view of a conventional bar coating apparatus.

Next, the operation of the bar coating apparatus 10 configured as described above is explained comparing with the bar coating apparatus shown in FIG. 4. The bar coating apparatus shown in FIG. 4, which corresponds to a conventional apparatus, differs from the bar coating apparatus 10 shown in FIG. 1 in that the weir plate 22 and the slit 32 are absent. The bar coating apparatus shown in FIG. 4 has only one slit 34 on the feed side of web with respect to the bar 16, so that coating is performed by supplying one kind of coating liquid to the slit 34. Therefore, if the viscosity of coating liquid is high or the wettability of coating liquid with respect to the web 12 is low, the coating liquid becomes difficult to get struck onto the web 12. Therefore, in the bar coating apparatus shown in FIG. 4, when a coating liquid having a high viscosity or a coating liquid having low wettability is applied, coating defects such as streaks and eye holes are liable to occur. In particular, as the coating speed (the speed of the web 12) increases, the coating defects are more liable to occur.

Contrarily, in the bar coating apparatus 10 shown in FIG. 1, the two slits 32 and 34 are provided on the feed side of the web 12 with respect to the bar 16, and a plurality of coating liquids are sent to the slits 32 and 34. Specifically, the upstream slit 32 on the feed side is supplied with a coating liquid having a lower viscosity than the coating liquids supplied to other slits 34 and 36. Therefore, the coating liquid having a low viscosity, which has high sticking properties, first comes into contact with the web 12, so that the properties of sticking to the web 12 become high, and the coating liquid having a high viscosity, which has low sticking properties, is applied onto the web surface having high sticking properties. Even in the case where it is desired to finally apply the coating liquid having a high viscosity, which has low sticking properties, since the properties of sticking to the web 12 can be improved, the occurrence of coating defects such as streaks and eye holes can be restrained. Therefore, an even coated surface shape can be obtained easily, and further the coating speed can be increased.

The first coating liquid having a low viscosity sent via the slit 32 mixes with the second coating liquid having a high viscosity sent via the slit 34 at the position indicated by the broken line in FIG. 1. This mixing poses no problem. In effect, the coating liquid having a high viscosity or a mixed coating liquid in which the coating liquids having a low viscosity and a high viscosity are mixed with each other has only to be applied to the web 12 after the coating liquid having a low viscosity, which has high sticking properties, has first been applied. Therefore, the coating liquid applied to the web 12 finally has a high viscosity as a whole, so that a coating liquid having a high viscosity can be applied to the web 12.

According to this embodiment, the two slits 32 and 34 are provided on the feed side of the web 12 with respect to the bar 16, and the first coating liquid supplied to the upstream slit 32 on the feed side has a lower viscosity than the second coating liquid supplied to the slit 34. Therefore, a coating liquid having a high viscosity as a whole can be applied in an even surface shape.

In the above-described embodiment, the two slits 32 and 34 are provided on the feed side of the web 12 with respect to the bar 16. However, the number of slits on the feed side of the web 12 with respect to the bar 16 is not limited to two, and three or more slits may be provided. For example, the bar coating apparatus shown in FIG. 2 differs from the bar coating apparatus 10 shown in FIG. 1 in that a weir plate 50 is provided on the upstream side of the weir plate 22. The weir plate 50 is provided in parallel with the weir plate 22 at a predetermined interval, and a slit 52 is formed between the weir plate 50 and the weir plate 22. The slit 52 is connected with a supply line 54, and a coating liquid is supplied via the supply line 54.

In the case of the bar coating apparatus configured as described above, of the slits 52, 32 and 34, the slit 52 is arranged on the upstream of the feed side. Therefore, the slit 52 is supplied with a first coating liquid having a low viscosity, and the slits 32 and 34 are supplied with a second coating liquid and a third coating liquid, which have a higher viscosity than the first coating liquid, respectively. The magnitude relationship of viscosities of the second and third coating liquids is not subject to any special restriction. However, it is preferable that the viscosity of the second coating liquid be lower than the viscosity of the third coating liquid because the coating liquids are easily mixed with each other.

In the case where such a bar coating apparatus is used, even if the coating liquid has a high viscosity as a whole, the first coating liquid having a low viscosity first comes into contact with the web 12, so that the occurrence of coating defects such as streaks and eye holes can be prevented. Thereby, an even coated surface shape can be obtained easily, and further the coating speed can be increased.

Figure 2:
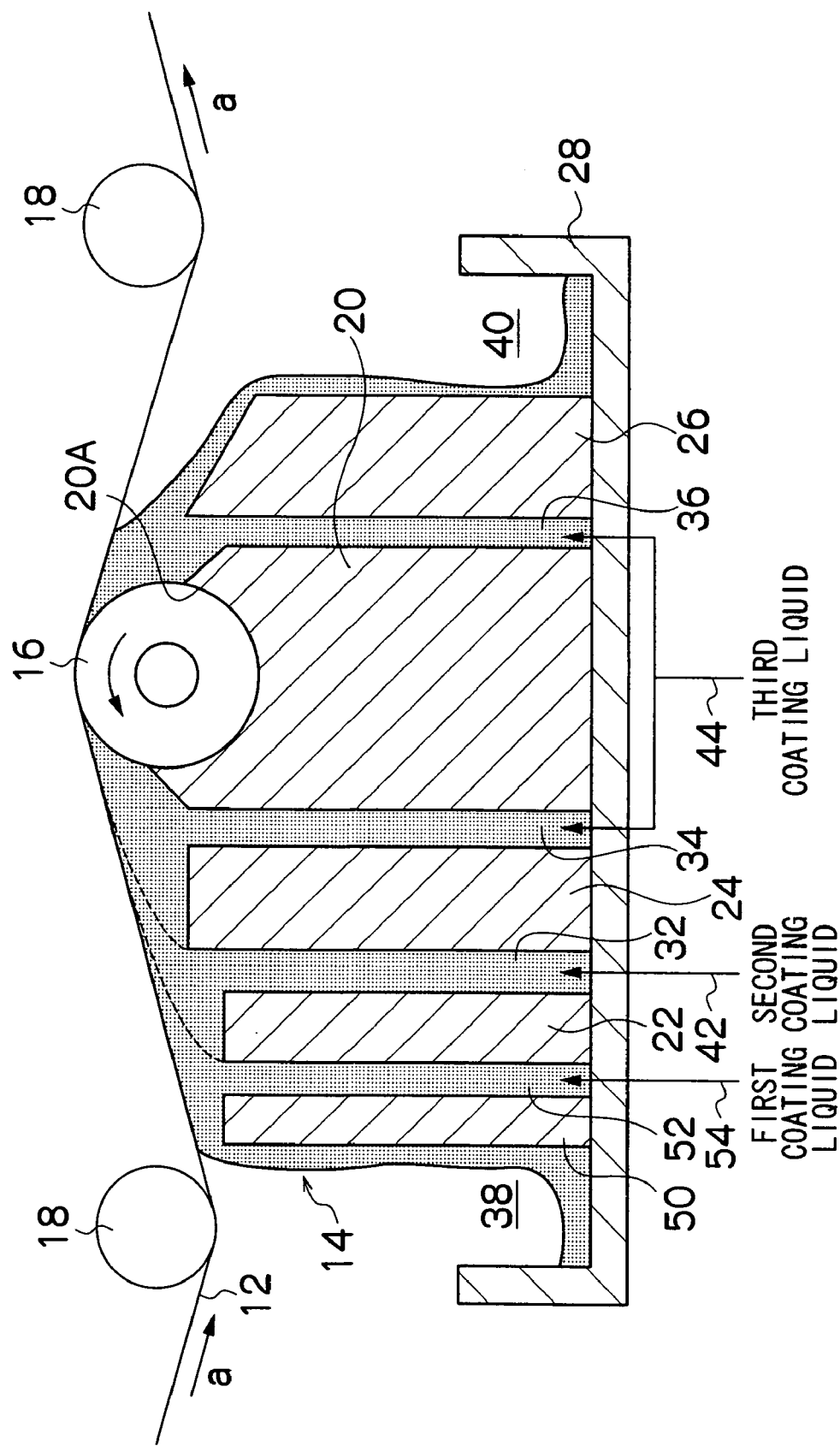
FIG. 2 is a configuration view of a bar coating apparatus having a configuration different from that shown in FIG. 1.
Figure 3:
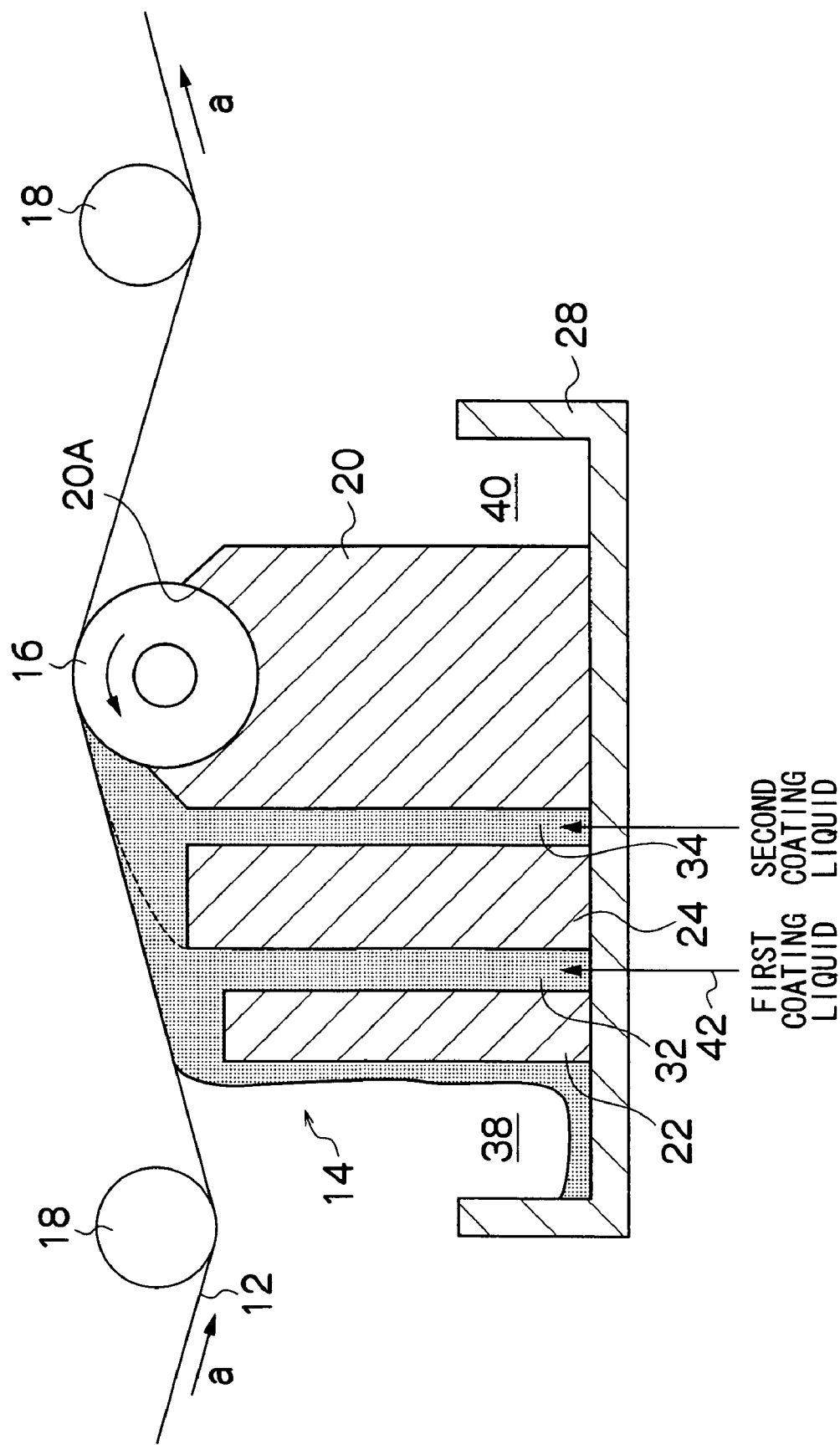
FIG. 3 is a configuration view of a bar coating apparatus having a configuration different from that shown in FIG. 1.

The bar coating apparatuses shown in FIGS. 1 and 2 have been explained by taking an example in which the slit 36 is also provided on the departure side of the web 12 with respect to the bar 16 (the downstream side). However, the slit 36 on the departure side is not necessarily needed. As shown in FIG. 3, the plurality of slits 32 and 34 may be provided only on the feed side of the web 12 with respect to the bar 16.

Also, in the above-described embodiment, the coating liquid having a low viscosity is supplied to the upstream slit on the feed side (the slit 32 in the case of FIG. 1, the slit 52 in the case of FIG. 2), and the coating liquid having a high viscosity is supplied to other slits (the slits 34 and 36 in the case of FIG. 1, the slits 32, 34 and 36 in the case of FIG. 2). However, the division of coating liquids is not limited to this. For example, a coating liquid having high wettability with respect to the web 12 may be supplied to the upstream slit on the feed side, and a coating liquid having low wettability may be supplied to other slits. In this case, even if the coating liquid has low wettability as a whole, the coating liquid having high wettability comes into contact with the web 12, so that coating defects such as streaks and eye holes are less liable to occur, and an even coated surface shape can be obtained easily. Therefore, the coating liquid having low wettability can be applied uniformly at a high coating speed.

Next, a second embodiment of a bar coating apparatus to which the present invention is applied is explained. The bar coating apparatus (not shown) of the second embodiment is configured in the same way as the bar coating apparatus 10 of the first embodiment shown in FIG. 1.

In the bar coating apparatus of the second embodiment, a coating liquid having a solvent composition the main component of which is a solvent having the highest surface tension of the solvents contained in a coating film forming solvent is supplied to the upstream slit 32 on the feed side. By supplying such a coating liquid to the upstream slit 32 on the feed side, the coating liquid having high surface tension is distributed on the surface (the upstream-side surface) of a coating liquid puddle (bead formed on the upstream side of the bar 16). Therefore, the stability of bead is improved, so that an even coated surface shape is obtained easily. Thereby, even the coating liquid having a high viscosity or low wettability, which has low sticking properties, can be applied uniformly, and further the coating speed can be increased.

In the above-described second embodiment, the coating liquid supplied to the upstream slit 32 on the feed side has only to be a coating liquid having a solvent composition the main component of which is a solvent having high surface tension. Therefore, the composition of coating liquid supplied to other slits 34 and 36 is not subject to any special restriction. The coating liquid supplied to other slits 34 and 36 has only to have a desired solvent composition when it mixes with the coating liquid sent from the slit 32. However, as in the case of the first embodiment, the coating liquid supplied to the upstream slit 32 on the feed side preferably has a lower viscosity or has higher wettability than the coating liquid supplied to other slits 34 and 36. Thereby, the capability for applying the coating liquid uniformly can further be increased.

In the second embodiment as well, the number of slits on the feed side of the web 12 with respect to the bar 16 is not subject to any special restriction, and has only to be plural. Therefore, as shown in FIG. 2, the three slits 52, 32 and 34 may be provided. In this case, the coating liquid having a solvent composition the main component of which is a solvent having high surface tension is supplied to the upstream slit 52 on the feed side. Thereby, the stability of bead can be enhanced, and the capability for applying the coating liquid uniformly can be increased significantly.

In the above-described first and second embodiments, the coating liquid having the same composition is supplied to the slits 32, 34, 36 and 52. However, the coating liquid having a different composition may be supplied. In this case as well, to the upstream slit on the feed side, the coating liquid having a lower viscosity than the coating liquid supplied to other slits is supplied, or to the upstream slit on the feed side, the coating liquid having a solvent composition the main component of which is a solvent having high surface tension is supplied, by which the capability for applying the coating liquid uniformly can be increased.

EXAMPLES

Example 1

A coating liquid having a solid content concentration of 15% and a viscosity of 1110 cp, consisting of an acrylic copolymerizing polymer solution with ethyleneglycol monomethyl ether and methanol being used as solvents, was applied to a PET film (web 12) using the bar coating apparatus shown in FIG. 1. At this time, to the upstream slit 32 on the feed side, ethyleneglycol monomethyl ether of 1.0 cp was sent so that a coating amount of 2 cc/m$^2$ was attained when the total quantity thereof got stuck onto the web, and a coating liquid of 110 cp was sent through the second slit 34. Using the bar, coating was performed at a coating speed of 100 m/min for a coating amount of 20 cc/m$^2$. As the result, the coating surface shape was satisfactory without defects such as streaks and eye holes.

Comparative Example 1

The same coating liquid as that of example 1 was applied at a coating speed of 100 m/min using the conventional apparatus shown in FIG. 4. As the result, although the sticking of liquid could be accomplished, streaks developed on the whole coating surface.

Example 2

A coating liquid having a polymer concentration of 18% and a viscosity of 190 cp, consisting of the same polymer as that of example 1, was applied to a PET film using the bar. From the second slit 34, coating was performed at a coating speed of 150 m/min for a coating amount of 20 cc/m$^2$. At this time, from the first slit 32, ethyleneglycol monomethyl ether was sent so that a coating amount of 3 cc/m$^2$ was attained. As the result, the coating surface shape was satisfactory without defects such as streaks and eye holes.

Comparative Example 2

The same coating liquid as that of example 2 was applied at a coating speed of 150 m/min using the conventional apparatus shown in FIG. 4. As the result, the coating surface shape was uneven.

Example 3

From the second slit 34, a coating liquid having a polymer concentration of 18% and a viscosity of 190 cp, consisting of the same polymer as that of example 1, was supplied, and was applied for a coating amount of 19.8 cc/m$^2$. From the first slit 32, a very low-concentration solution having a polymer concentration of 1% and a viscosity of 3 cp, having the same composition, was supplied, and was applied to a PET film at a coating speed of 150 m/min so that a coating amount of 3 cc/m$^2$ was attained. As the result, the coating surface shape was satisfactory without coating defects such as streaks and eye holes.

Example 4

A coating liquid having a solid content concentration of 15% and a viscosity of 110 cp, consisting of an acrylic copolymerizing polymer solution with ethyleneglycol monomethyl ether and methanol being used as solvents, was applied to an aluminum substrate with a thickness of 0.2 mm for a coating amount of 20 cc/m$^2$ using the bar coating apparatus shown in FIG. 1.

As the aluminum substrate, a commercially available substrate was used by being degreased and cleaned. To the first slit 32, ethyleneglycol monomethyl ether was sent so that a coating amount of 2 cc/m$^2$ was attained when the total quantity thereof got stuck onto the substrate. From the second slit 34, a coating liquid having a viscosity of 110 cp was sent, and was applied at a coating speed of 100 m/min for a coating amount of 20 cc/m$^2$ using the bar. As the result, the coating surface shape was satisfactory without coating defects such as streaks and eye holes.

Comparative Example 3

The same coating liquid as that of example 4 was applied at a coating speed of 100 m/min using the conventional apparatus shown in FIG. 4. As the result, although the sticking of liquid could be accomplished, streaks developed on the whole coating surface.

What is claimed is:

1. A bar coating method comprising the step of:
   weighing and applying a coating liquid by the bar with bringing the bar into contact with a continuously running web and supplying the coating liquid to an feed side of the web with respect to the bar to form a coating liquid puddle, wherein
   a plurality of coating liquids are supplied to the feed side of the web with respect to the bar via a plurality of slits formed in a multistage form in an feed direction of the web; and
   wherein a coating liquid supplied to the upstream slit on the feed side of the web, of the plurality of slits formed in a multistage form has a solvent composition the main component of which is a solvent having a highest surface tension of solvents contained in a coating film forming solvent; and wherein the coating liquids fed from the plurality of slits comprise a common solvent, and the viscosity of the coating liquid is varied for each slit on an upstream side of the bar; and further comprising feeding solution to the web on a downstream side of the bar, said solution fed on the downstream side of the bar comprising the common solvent mixed to a higher viscosity than coating liquids fed on the upstream side.

2. The bar coating method according to claim 1, wherein a coating liquid supplied to the upstream slit on the feed side of the web, of the plurality of slits formed in a multistage form has a lower viscosity than a coating liquid supplied to the other slits.

* * * * *